United States Patent
Verma et al.

(10) Patent No.: US 6,372,652 B1
(45) Date of Patent: Apr. 16, 2002

(54) METHOD FOR FORMING A THIN-FILM, ELECTRICALLY BLOWABLE FUSE WITH A REPRODUCIBLE BLOWING WATTAGE

(75) Inventors: Purakh Raj Verma; Zia Alan Shafi, both of Singapore (SG); Yu Shan, Beijing (CN); Zeng Zheng, Singapore (SG); Manju Sarkar, Singapore (SG); Shao-Fu Sanford Chu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/494,633

(22) Filed: Jan. 31, 2000

(51) Int. Cl.[7] ............................................. H01L 21/302
(52) U.S. Cl. ....................... 438/706; 438/719; 438/720; 438/723
(58) Field of Search ................................. 438/130–132, 438/600, 601, 719, 720, 721, 722; 257/529

(56) References Cited

U.S. PATENT DOCUMENTS

| | | | |
|---|---|---|---|
| 5,578,861 A | * 11/1996 | Kinoshita et al. | 257/529 |
| 5,729,041 A | 3/1998 | Yoo et al. | 257/529 |
| 5,747,868 A | * 5/1998 | Reddy et al. | 257/529 |
| 5,748,685 A | 5/1998 | Reddy et al. | 057/529 |
| 5,760,453 A | 6/1998 | Chen | 257/529 |
| 5,821,160 A | 10/1998 | Rodriguez et al. | 438/601 |
| 5,851,903 A | 12/1998 | Stamper | 438/467 |
| 5,872,390 A | 2/1999 | Lee et al. | 257/529 |
| 5,879,966 A | 3/1999 | Lee et al. | 438/132 |
| 5,888,851 A | 3/1999 | Motonami et al. | 438/132 |
| 5,891,762 A | 4/1999 | Sakai et al. | 438/132 |
| 5,895,262 A | 4/1999 | Becker et al. | 438/601 |
| 5,968,847 A | * 10/1999 | Ye et al. | 438/734 |
| 6,010,966 A | * 1/2000 | Ionov | 438/706 |
| 6,080,681 A | * 6/2000 | Tabara | 438/720 |
| 6,168,977 B1 | * 1/2001 | Konishi | 438/132 |

* cited by examiner

Primary Examiner—Benjamin L. Utech
Assistant Examiner—Duy-vu Deo
(74) Attorney, Agent, or Firm—George O. Saile; Rosemary L. S. Pike

(57) ABSTRACT

A method for forming a thin film, electrically blowable fuse with reproducible blowing wattage using a sacrificial metal patch over a fuse dielectric layer and two etch processes; wherein the first etch process is selective to the metal patch and the second etch process is selective to the fuse dielectric layer. A fuse element, having an element width, is formed over a semiconductor structure, and a fuse dielectric layer is formed over the fuse element. A sacrificial metal patch is formed on the fuse dielectric layer; wherein the patch width being greater than the fuse element width. A second dielectric layer is formed on the sacrificial metal patch, and additional metal layers and dielectric layers may be formed over the second dielectric layer, but only the dielectric layers will remain over the fuse element. The second dielectric layer and any overlying dielectric layers are patterned to form a fuse window opening, having a width greater than the sacrificial metal patch, using a first fuse window etch selective to the sacrificial metal patch. Then, the sacrificial metal patch is etched through the fuse window opening using a second fuse window etch selective to the fuse dielectric layer, leaving a reproducible thickness of the fuse dielectric layer overlying the fuse element; thereby providing a reproducible blowing wattage.

16 Claims, 5 Drawing Sheets

METHOD FOR FORMING A THIN-FILM, ELECTRICALLY BLOWABLE FUSE WITH A REPRODUCIBLE BLOWING WATTAGE

BACKGROUND OF INVENTION

1) Field of the Invention

This invention relates generally to fabrication of a semiconductor device and more particularly to a method for forming a thin-film, electrically blowable fuse with a reproducible blowing wattage, or for forming a thin-film laser blowable fuse with reproducible blowing power.

2) Description of the Prior Art

In modern semiconductor design, it is often desirable to provide polysilicon or other thin film fuses which can be selectively blown based upon the results of circuit testing. For example, several resistors can be designed in parallel, each having a fuse. One or more of the fuses can then be blown depending upon test results to trim the resistance of the group of parallel resistors and achieve the desired circuit characteristics.

To increase manufacturing productivity, circuit testing is frequently performed using an automatic tester. Productivity can be further increased by programming the automatic tester to electrically blow selected fuses during the automatic test cycle. However, to do this, the fuses must have a reproducible blowing wattage across the wafer and wafer to wafer.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,895,262 (Becker et al.) shows a fuse window etching method using a patch layer over a dielectric layer over a fuse, wherein the fuse comprises a conductive layer with an overlying silicon nitride layer. A stack of dielectric layers overlying the patch are etched by an etch process selective to the patch material; the patch material is etched using an etch which is not selective to the patch material; and the dielectric material overlying the fuse is etched using an etch method selective to silicon nitride. This invention teaches that the patch layer is preferably composed of polysilicon or silicon nitride.

U.S. Pat. No. 5,821,160 (Rodriguez et al.) teaches a polysilicon etch stop layer over a fuse dielectric layer.

U.S. Pat. No. 5,851,903 (Stamper) recites a tungsten barrier layer between fuses.

U.S. Pat. No. 5,879,966 (Lee et al.) teaches a protective coating over a fuse opening.

U.S. Pat. No. 5,760,453 (Chen) discloses a barrier layer over a fuse.

U.S. Pat. No. 5,729,041 (Yoo et al.) and U.S. Pat. No. 5,888,851 (Motonami et al.) show a protective film over a fuse window.

U.S. Pat. No. 5,891,762 (Sakai et al.) shows a polysilicon layer formed over a fuse concurrently with a cell plate and used as a fuse window etch stop.

SUMMARY OF THE INVENTION

It is an object of the present invention to provide a method for forming a thin-film, electrically blowable fuse with a reproducible blowing wattage.

It is another object of the present invention to provide a method for forming a thin-film, electrically blowable fuse with a reproducible blowing wattage by controlling the thickness of a fuse dielectric layer overlying the fuse element using a sacrificial metal patch overlying the fuse dielectric layer and a two step etch wherein the first etch step etches a dielectric layer overlying the sacrificial metal patch selective to the material of the sacrificial metal patch and the second etch step etches the sacrificial metal patch selective to the fuse dielectric layer.

It is another object of the present invention to provide a method for forming a semiconductor device with a thin-film, electrically blowable fuse with a reproducible blowing wattage or a thin-film, laser blowable fuse with reproducible blowing power with a reduced number of processing steps.

It is another object of the present invention to provide a method for forming an blowable fuse and a ring surrounding the blowable fuse from the same layer of conductive fuse material to provide uniform topography and dielectric thickness both in dense areas and open areas of a circuit.

It is yet another object of the present invention to provide a method for forming an electrically blowable fuse with improved reliability by terminating the fuse window opening above the tapered portion of the fuse element so that the metal contacts are not affected by cracking and heating when the fuse element is blown.

To accomplish the above objectives, the present invention provides a method for forming a thin film, electrically blowable fuse with reproducible blowing wattage using a sacrificial metal patch over a fuse dielectric layer and two etch processes; wherein the first etch process is selective to the metal patch and the second etch process is selective to the fuse dielectric layer. A fuse element, having an element width, is formed over a semiconductor structure, and a fuse dielectric layer is formed over the fuse element. A sacrificial metal patch is formed on the fuse dielectric layer; wherein the patch width being greater than the fuse element width. A second dielectric layer is formed on the sacrificial metal patch, and additional metal layers and dielectric layers may be formed over the second dielectric layer, but only the dielectric layers will remain over the fuse element. The second dielectric layer and any overlying dielectric layers are patterned to form a fuse window opening, having a width greater than the sacrificial metal patch, using a first fuse window etch selective to the sacrificial metal patch. Then, the sacrificial metal patch is etched through the fuse window opening using a second fuse window etch selective to the fuse dielectric layer, leaving a reproducible thickness of the fuse dielectric layer overlying the fuse element; thereby providing a reproducible blowing wattage.

The present invention provides considerable improvement over the prior art. The inventors have determined that the thickness of the fuse dielectric layer is critical for an electrically blowable fuse with a reproducible blowing wattage. Blowing wattage is a function of the resistance of the fuse element and the thickness of the use dielectric layer overlying the fuse element when it is blown. To electrically blow a fuse, the fuse element must be vaporized. If the fuse dielectric layer is too thick, vaporization is difficult and the fuse is poorly blown. However, if the fuse dielectric layer is too thin, then the fuse element will be attacked by the etch used to form a fuse window, and the resistance of the fuse element will be altered, changing the blowing wattage. The present invention provides good control over the thickness of the fuse dielectric layer, thereby providing a reproducible blowing wattage.

By forming the fuse element as part of the poly-1 layer, forming the fuse dielectric layer as part of the inter-layer dielectric layer, and/or forming the patch layer as part of the metal-1 layer, a device can be formed with an electrically blowable fuse with a reproducible blowing wattage using a reduced number of processing steps. Nitride or other dielectric film patches require additional (non-standard to CMOC or Bipolar or BiCMOS process) depositions and/or masking steps.

Also, by forming the fuse opening over the tapered portion of the fuse element the semiconductor device reliability is increased. The fuse element cracks and vaporizes in the narrow potion. By terminating the fuse opening over the tapered portion of the fuse element, the metal contacts are away from the cracking point, and the metal is not melted when the fuse is blown.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1B and 2 are taken generally along axis 1B—1B' as shown in FIG. 1A. FIGS. 3B and 4 are taken generally along axis 3B—3B' as shown in FIG. 3A. FIGS. 5B and 6 are taken generally along axis 5B—5B' as shown in FIG. 5A.

DETAILED DESCRIPTION OF THE INVENTION

The present invention will be described in detail with reference to the accompanying drawings. The present invention provides a method for forming a thin-film, electrically blowable fuse with a reproducible blowing wattage.

Figure 1A:
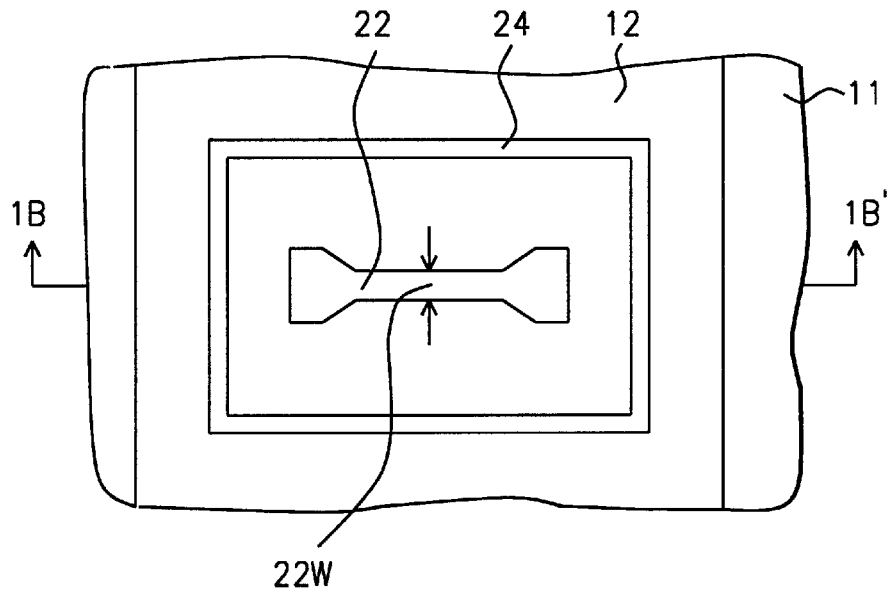
FIGS. 1A, 3A & 5A illustrate sequential top views of a process for forming a thin-film, electrically blowable fuse with a reproducible blowing wattage according to the present invention.
Figure 1B:
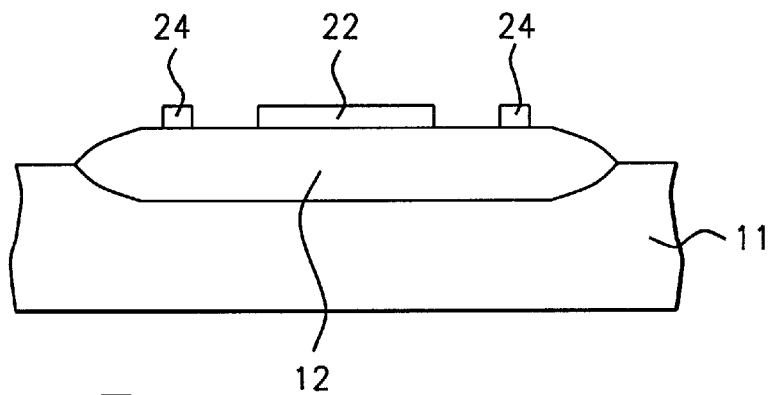
FIGS. 1B, 2, 3B, 4, 5B & 6 illustrate sequential sectional views of a process for forming a thin-film, electrically blowable fuse with a reproducible blowing wattage according to the present invention.

Referring to FIGS. 1A and 1B, the process begins by providing a semiconductor structure (11). Semiconductor structure (11) should be understood to include to possibly include a wafer or substrate composed of a semiconductor material such as monocrystalline silicon, or anther structure as is known in the art such as a silicon-on-insulator (SOI) structure. Semiconductor structure (11) should be understood to possibly further include one or more conductive layers and insulating layers and/or one or more active and passive devices formed on or over such wafer or substrate.

A fuse element (22) is formed over a semiconductor structure (11). In one embodiment, as illustrated in FIG. 1B, the fuse element (22) is formed on an isolation structure (12) (e.g. STI, LOCOS, etc). The isolation structure (12) defines and separates active areas of the semiconductor structure (11). The fuse element (22) can be formed by depositing a conductive layer and patterning it using photolithography. The fuse element is preferably composed of polysilicon having a thickness of between about 1000 Angstroms and 5000 Angstroms. The fuse element (22) has a width (22W) as shown in FIG. 1A which is preferably between about 1.0 microns and 6.0 microns.

Optionally, a retention ring (24) can be formed surrounding the fuse element (22) to provide a more uniform topography. The retention ring (24) can be formed simultaneously with the fuse element, using the same material as the fuse element.

Figure 2:
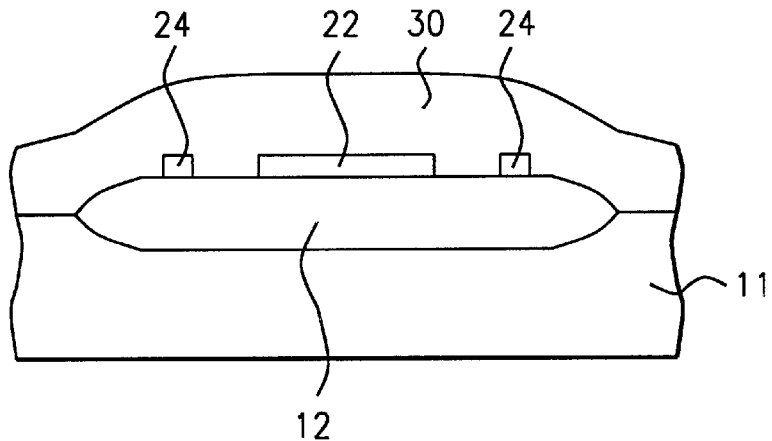

Referring to FIG. 2, a fuse dielectric layer (30) is formed on the fuse element (22) and the retention ring (24). The fuse dielectric layer (30) is preferably composed of TEOS oxide doped with boron and/or phosphorous ions at a concentration of between about 4 weight-% and 5 weight-%$m^3$. The fuse dielectric layer (30) is preferably formed to a thickness of between about 3000 Angstroms and 9000 Angstroms.

Figure 3A:
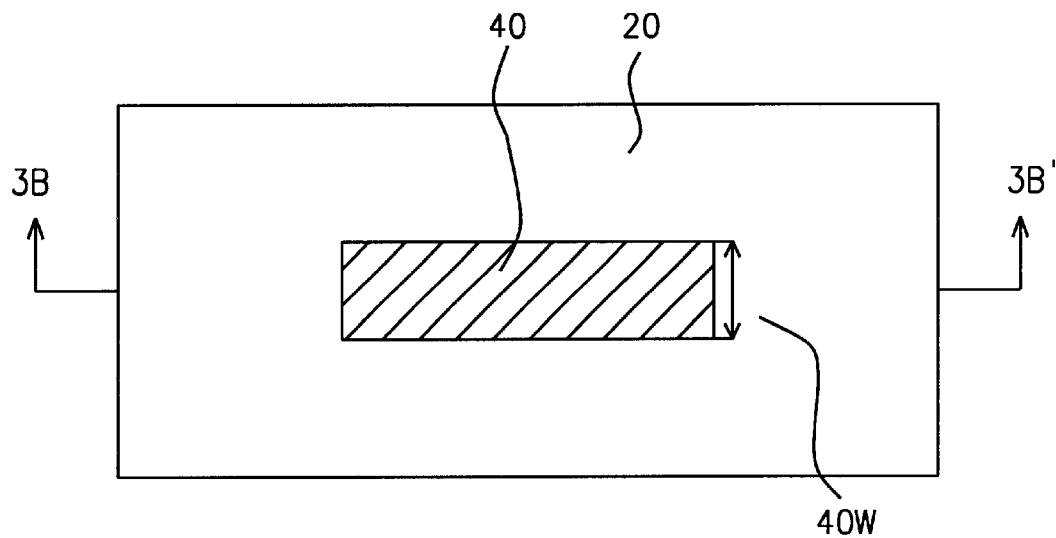
Figure 3B:
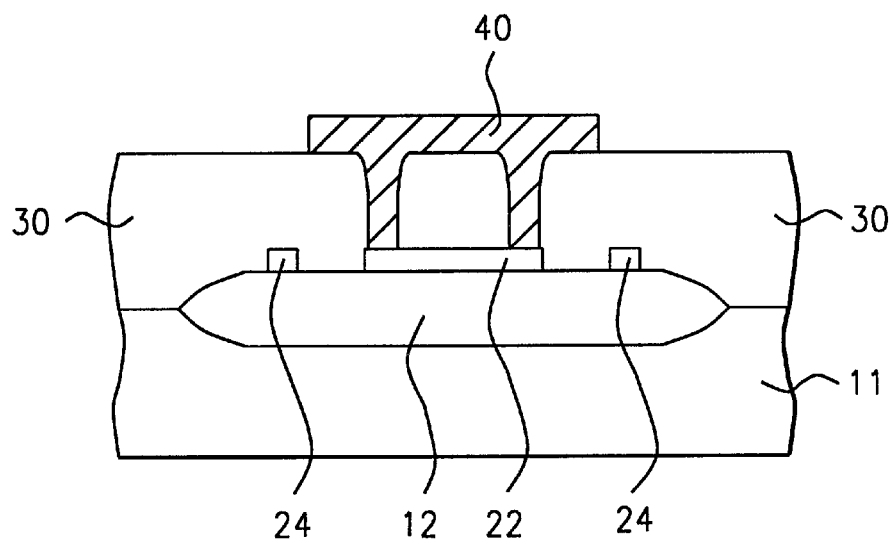

Referring to FIGS. 3A and 3B a sacrificial metal patch (40) is formed over the fuse dielectric layer (30), having a patch width (40W), as shown in FIG. 3A. To prevent overetching of the fuse dielectric layer (30), the patch width (40W) must greater than the element width (22W). The sacrificial metal patch (40) can be composed of copper, tungsten, aluminum, titanium, TiW, or most preferably Al-Si-Cu, having a thickness of between about 4000 Angstroms and 10,000 Angstroms.

Figure 4:
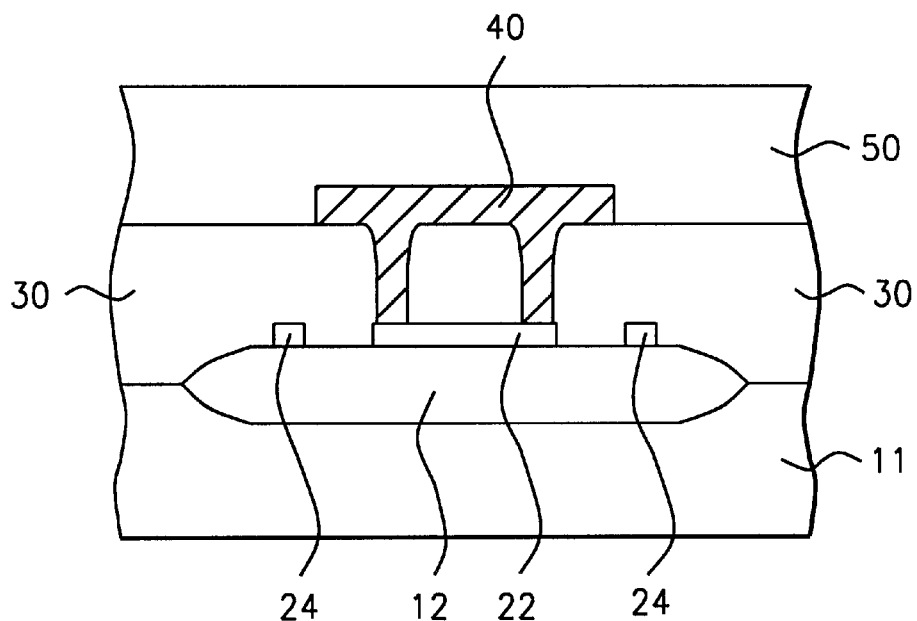

Referring to FIG. 4, a second dielectric layer (50) is formed on the sacrificial metal patch (40). The second dielectric layer (50) can be composed of CVD oxide, nitride, or most preferably PECVD oxide having a thickness of between about 4000 Angstroms and 10,000 Angstroms. Additional dielectric layers possibly including one or more passivation layers may be formed over the second dielectric layer (50).

Figure 5A:
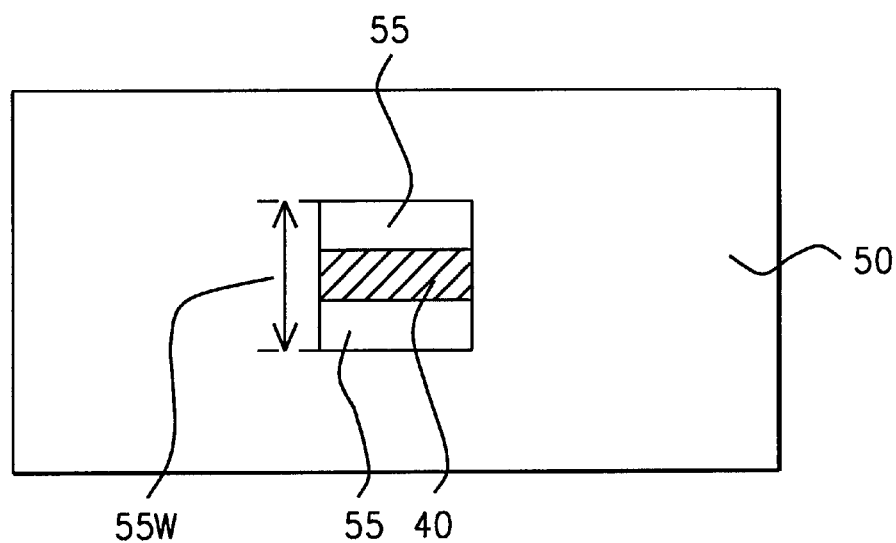
Figure 5B:
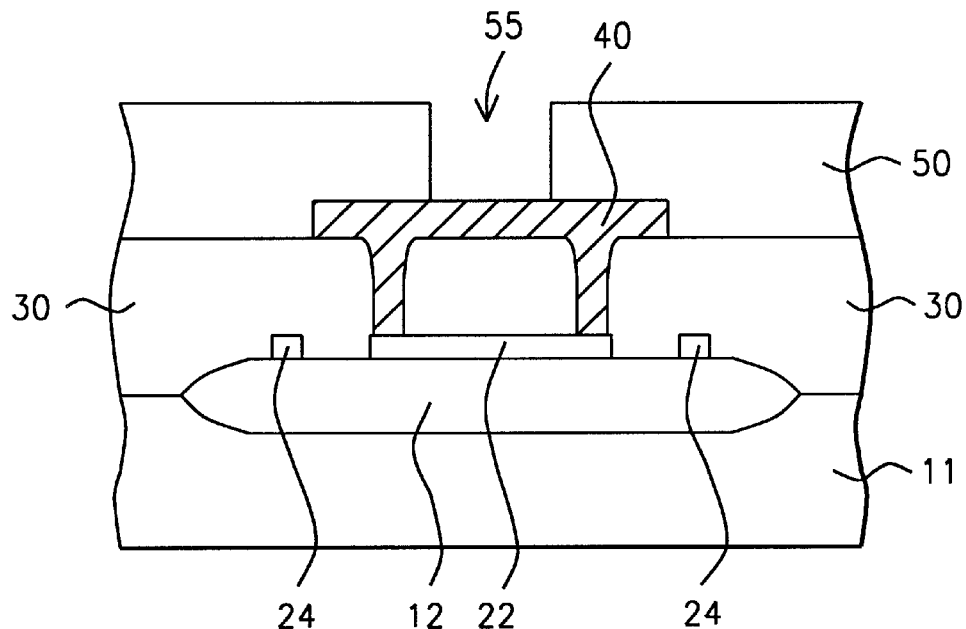

As shown in FIGS. 5A and 5B, the second dielectric layer (50) and any overlying layers are patterned to form a fuse window (55), having a window width (55W). The window width (55W) is greater than the patch width (40W), causing the patch to be completely separated by the fuse window etch. In the opposite direction, the fuse window preferably terminates over the tapered portion of the fuse element, providing protection against melting the metal contacts on the fuse element. The second dielectric layer (50) and overlying layers can be patterned by forming a fuse window etch mask (not shown) with an opening corresponding to the intended fuse window using photolithography and etching the second dielectric layer (50) and overlying layers through the opening, using an etch selective to the sacrificial metal patch (40).

The second dielectric layer (50) and overlying layers are etched using a first fuse window etch, comprising a dielectric dry etch process with a $CF_4$, $CHF_3$, Ar chemistry (standard via etch recipe).

A key advantage of the present invention is that the sacrificial metal patch (40) and the first window etch chemistry provide an etch selectivity of greater than 100:1 of the second dielectric layer (50) to the sacrificial metal patch (40) (e.g. the first fuse window etch etches the second dielectric layer etches 100 times as fast as it etches the sacrificial metal patch).

Figure 6:
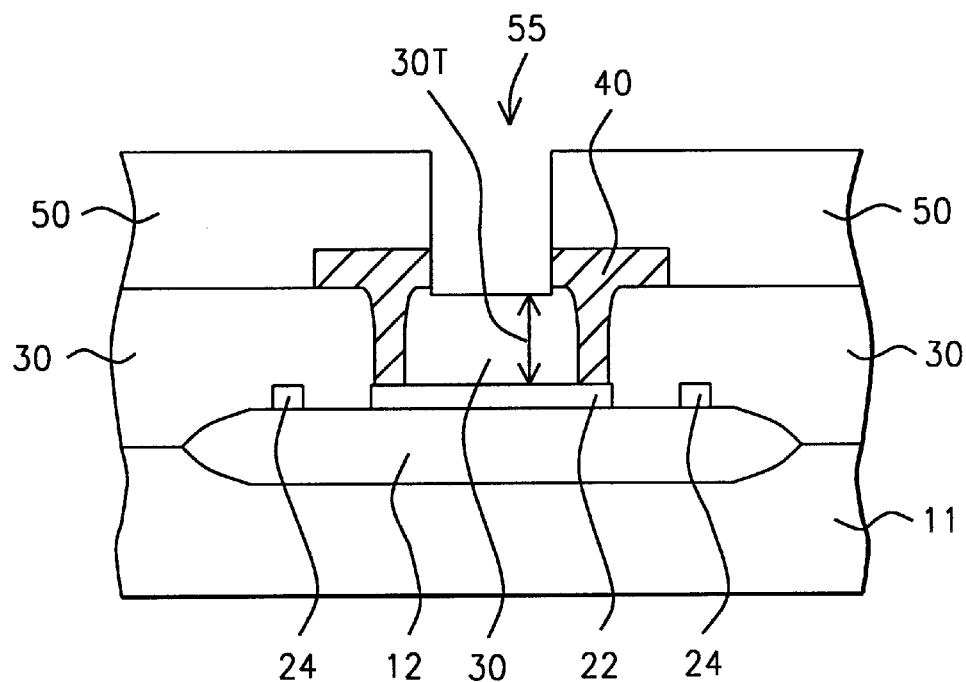

Referring to FIG. 6, the sacrificial metal patch (40) is etched through the fuse window (55) using a second fuse window etch which is selective to the fuse dielectric layer (30). Preferably, the sacrificial metal patch (40) is etched using a dry etch process with a $BCl_3$, $Cl_2$, $SF_6$ chemistry, providing a selectivity of greater than 2:1 of the sacrificial metal patch (40) to the fuse dielectric layer (30) (e.g. the second fuse window etch etches the sacrificial metal patch 2 times as fast as it etches the fuse dielectric layer). The remaining fuse dielectric layer (30) has a thickness (30T) of between about 400 Angstroms and 6000 Angstroms, providing a reproducible blowing wattage. The target thickness can be selected depending upon the fuse vaporizing power required.

PREFERRED EMBODIMENT OF THE PRESENT INVENTION—FIGS. 7 & 8

Figure 7:
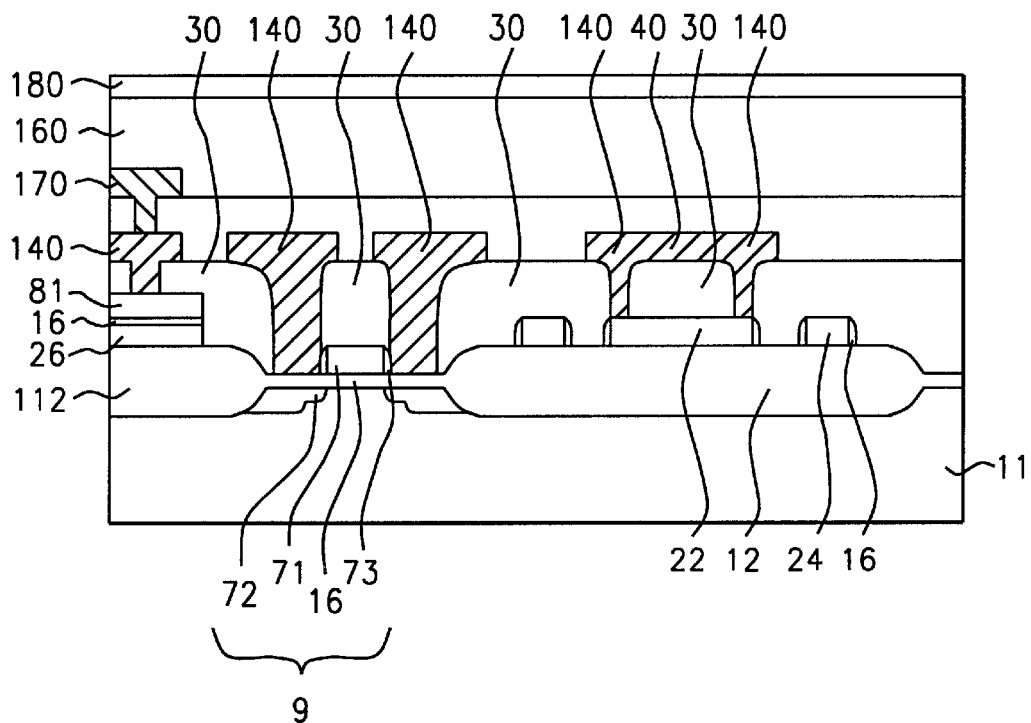
FIGS. 7 & 8 illustrate sequential sectional views of a device formed according to a preferred embodiment of the present invention.

Referring to FIG. 7, a preferred embodiment of the present invention begins by providing a semiconductor structure (11) having an isolation structure thereon, and having a fuse element (22) and a retention ring (24) formed on the isolation structure (12), as described hereabove. The semiconductor structure (11) further comprises an active area (9) adjacent to the isolation structure (12), and may further comprise a second isolation structure (112) with a lower capacitor plate (26) thereon.

The fuse element (22), the retention ring (24) and an optional lower capacitor plate (26) are formed by depositing a first polysilicon layer (not shown) and patterning it using photolithography. The first polysilicon layer preferably has a thickness of between about 1000 Angstroms and 5000 Angstroms.

A silicon oxide layer (16) can optionally be grown on the fuse element (22), on the retention ring (24), an on the semiconductor structure (11) in active areas. The silicon oxide layer, which is preferably grown to a thickness of between about 40 Angstroms and 500 Angstroms, forms a gate dielectric in the active area and a capacitor dielectric over the lower capacitor plate.

A second polysilicon layer is formed on the silicon oxide layer (16), and patterned to form a gate electrode (71) in the active area and a top capacitor plate (81) over the lower capacitor plate (26). Source and drain regions (72) are formed adjacent to the gate electrode (71), and sidewall spacers (73) are formed on the gate electrode (71) to form a transistor in the active area.

A fuse dielectric layer (30) is formed over the fuse element (22) as described hereabove, wherein the fuse dielectric layer (30) is also an inter-level dielectric layer formed over the gate electrode (71) and the top capacitor plate (81). The fuse dielectric layer (30) is patterned to form opening over the top capacitor plate (81), the source and drain regions (72) and both ends of the fuse element (22).

A first metal layer is formed over the fuse dielectric layer (30) and in the openings over the top capacitor plate (81), the source and drain regions (72) and both ends of the fuse element (22). The first metal layer is patterned to form interconnects, lines, and contact pads (140) as appropriate for the top capacitor plate, the source and drain regions, and the ends of the fuse element, as well as forming the sacrificial metal patch. It should be noted that in this embodiment, the sacrificial metal patch (40) is connected to contact pads (140) for the fuse element (22).

A second dielectric layer (50) (e.g. first inter-metal dielectric layer) is formed over the first metal layer, then patterned to form via openings as appropriate. A second metal layer is formed over the second dielectric layer (50) and patterned to form vias, interconnects and contact pads as appropriate for the devices which have been formed below. Additional inter-metal dielectric layers (160) and metal layers (170) can be formed as necessary to complete the semiconductor circuitry. Typically, each inter-metal dielectric layer is planarized prior to being patterned, using one of a variety of processes known in the art, such as chemical-mechanical polishing (CMP) or etch-back. A passivation layer (180) is formed over the last metal layer.

Figure 8:
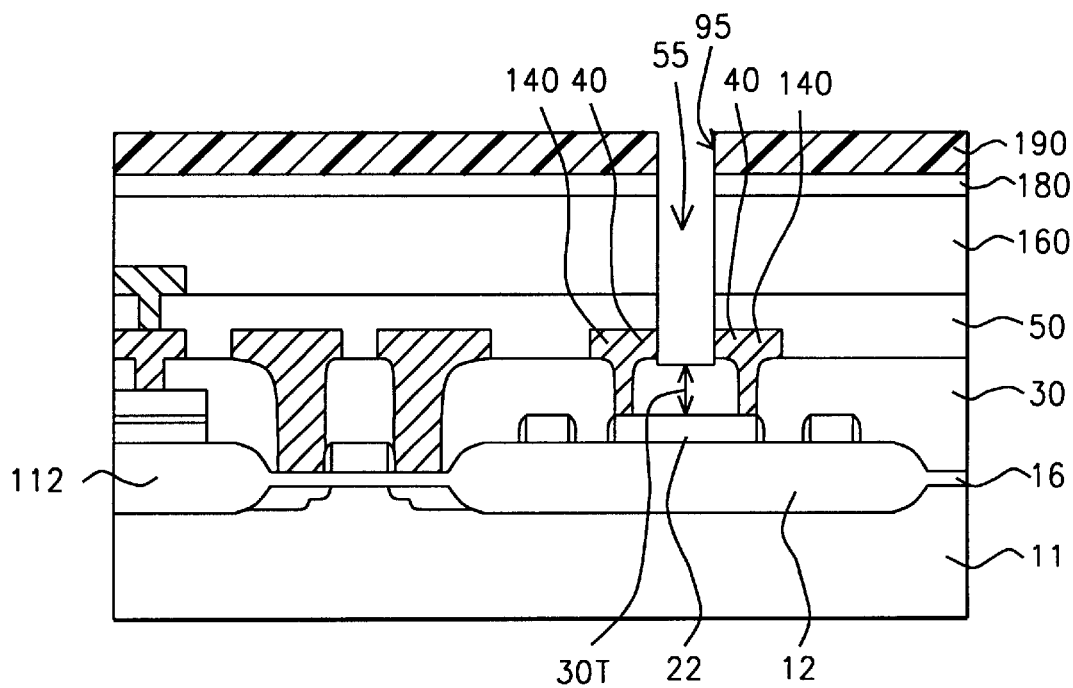

Referring to FIG. 8, a fuse window etch mask (190), preferably composed of photoresist, is formed over the passivation layer (180). The fuse window etch mask (190) has an opening (195) above the fuse element (22). The second dielectric layer (50) and the additional inter-metal dielectric layers (160) are patterned through the opening (195) in the fuse window etch mask (190) using a first fuse window etch to form a fuse window opening (55), as described hereabove. The sacrificial metal patch (40) provides a good etch stop for the first fuse window etch, having a selectivity of greater than 100:1 of the second dielectric layer (50) to the sacrificial metal patch (40).

The sacrificial metal patch (40) is then etched through the fuse window opening (55) using a second fuse window etch as described hereabove. The second fuse window etch provides a selectivity of greater than 2:1 of the sacrificial metal patch (40) to the fuse dielectric layer (30). The second fuse window etch completely severs the sacrificial metal patch (40) and leaves a thickness (30T) of the fuse dielectric layer (30). The remaining thickness (30T) of the fuse dielectric layer (30) is critical to providing a reproducible fuse blowing wattage as described herein.

While the invention has been particularly shown and described with reference to the preferred embodiments thereof, it will be understood by those skilled in the art that various changes in form and details may be made without departing from the spirit and scope of the invention. For example, although the preferred embodiment of the present invention is for an electrically blowable fuse, the present invention can be practiced with a laser blown fuse. Lase blown fuses also require a constant thickness dielectric layer with a minimum thickness on the fuse element, although the requirement is not as stringent.

What is claimed is:

1. A method for forming a thin film, blowable fuse, comprising the steps of:
   a. forming a fuse element over a semiconductor structure, said fuse element having a narrow portion with an element width and tapered portions on either end of said narrow portion;
   b. forming a fuse dielectric layer on said fuse element;
   c. forming on said fuse dielectric layer a patterned first metal interconnect layer comprising a sacrificial metal patch, having a patch width, said patch width being greater than said fuse element width;
   d. forming a second dielectric layer on said sacrificial metal patch;
   e. patterning said second dielectric layer to form a fuse window, having a window width, using a first fuse window etch selective to said sacrificial metal patch; said window width being greater than said patch width; said fuse window terminating over said narrow portion of said fuse element; and
   f. etching said sacrificial metal patch through said fuse window using a second fuse window etch selective to said fuse dielectric layer.

2. The method of claim 1 wherein said fuse element is composed of polysilicon having a thickness of between about 1000 Angstroms and 5000 Angstroms, and said fuse dielectric layer is composed of TEOS oxide doped with phosphorous ions and/or boron ions at a concentration of between about 4 weight-% and 5 weight-% and having a thickness of between about 3000 Angstroms and 9000 Angstroms.

3. The method of claim 1 wherein said fuse dielectric layer is patterned to form contact openings over said fuse element.

4. The method of claim 1 wherein said sacrificial metal patch is composed of titanium, aluminum-silicon-copper, or titanium-tungsten, and has a thickness of between about 4000 Angstroms and 10,000 Angstroms.

5. The method of claim 1 wherein said etching of said sacrificial metal patch through said fuse window is terminated when said fuse dielectric layer attains a thickness of between about 400 Angstroms and 6000 Angstroms over said fuse element.

6. The method of claim 1 wherein said first fuse window etch is performed using a dry etch process with a $CF_4$, $CHF_3$, Ar chemistry and said second fuse window etch is performed using a dry etch process with a $BCl_3$, $Cl_2$, $SF_6$ chemistry.

7. The method of claim 5 wherein:
said fuse dielectric layer is composed of boron and phosphorous doped TEOS oxide formed to a thickness of between about 3000 Angstroms and 9000 Angstroms;
said second dielectric layer is composed of CVD oxide and is etched using a dry etch process with a $CF_4$,$CHF_3$, Ar chemistry having a selectivity to said sacrificial metal patch of greater than 100:1; and
said sacrificial metal patch is composed of titanium, aluminum-silicon-copper, or titanium-tungsten formed to a thickness of between about 4000 Angstroms and 10,000 Angstroms and etched using a dry etch process with a $BCl_3$,$Cl_2$, $SF_6$ chemistry having a selectivity to said fuse dielectric layer of greater than 2:1.

8. A method for forming a reproducible thin film, blowable fuse, comprising the steps of:
a. providing a semiconductor structure; said semiconductor structure have an isolation structure thereon;
b. forming a polysilicon layer over said isolation structure, and patterning said polysilicon layer to form (1) a fuse element, having a narrow area with a fuse element width and tapered areas on either end of said narrow area, and to form (2) a retention ring; said retention ring surrounding said fuse structure;
c. forming a fuse dielectric layer over said fuse structure and said retention ring; said fuse dielectric layer being composed of TEOS oxide doped with phosphorous and/or boron ions at a concentration of between about 4 weight-% and 5 weight-% and formed to a thickness of between about 3000 Angstroms and 9000 Angstroms,
d. forming a sacrificial metal patch on said first dielectric layer; said sacrificial metal patch having a width greater than said width of said fuse element;
e. forming a second dielectric layer over said sacrificial metal patch;
f. forming a passivation layer over said second dielectric layer;
g. patterning said passivation layer and said second dielectric layer to form a fuse window using a first fuse window etch selective to said sacrificial metal patch, and using said sacrificial metal patch as an etch stop; said fuse window having a width greater than the width of said sacrificial metal patch and terminating over said tapered portion of said fuse element; and
h. etching said sacrificial metal patch through said fuse window using a second fuse window etch selective to said first dielectric layer.

9. The method of claim 8 which further includes forming and patterning additional metal layers and additional dielectric layers over said second dielectric layer prior to forming said passivation layer, wherein no portion of said additional metal layer are left over said fuse element.

10. The method of claim 8 wherein said sacrificial metal patch is composed of titanium, aluminum-silicon-copper, or titanium-tungsten having a thickness of between about 4000 Angstroms and 10,000 Angstroms, and said second dielectric layer is composed of CVD oxide having a thickness of between about 4000 Angstroms and 6000 Angstroms.

11. The method of claim 8 wherein said first fuse window etch is performed using a dry etch process with a $CF_4$, $CHF_3$, Ar chemistry and said second fuse window etch is performed using a dry etch process with a $BCl_3$, $Cl_2$, $SF_6$ chemistry.

12. The method of claim 8 wherein, following said etching of said sacrificial metal patch through said fuse window, said first dielectric layer has a thickness of between about 400 Angstroms and 6000 Angstroms over said fuse element.

13. The method of claim 11 wherein, following said etching of said sacrificial metal patch through said fuse window, said first dielectric layer has a thickness of between about 400 Angstroms and 6000 Angstroms over said fuse element.

14. A method for forming a semiconductor device having an electrically blowable fuse element with a reproducible blowing wattage, comprising the steps of:
a. providing a semiconductor structure; said semiconductor structure have an isolation structure and a second isolation structure thereon with an active area between said isolation structure and said second isolation structure;
b. forming a polysilicon layer over said isolation structure, and patterning said polysilicon layer to form a fuse element, having a width, a retention ring, and a lower capacitor plate; said retention ring surrounding said fuse structure;
c. growing an silicon oxide layer on said fuse element, said retention ring, and said lower capacitor plate;
d. forming a second polysilicon layer on the silicon oxide layer, and patterned said second polysilicon layer to form a gate electrode in said active area and a top capacitor plate over the lower capacitor plate;
e. forming source and drain regions adjacent to the gate electrode, and forming sidewall spacers on the gate electrode to form a transistor in the active area;
f. forming a fuse dielectric layer over said fuse structure and said retention ring; said fuse dielectric layer composed of boron and phosphorous doped TEOS oxide formed to a thickness of between about 3000 Angstroms and 9000 Angstroms;
g. forming a metal layer on said fuse dielectric layer, and patterning said metal layer to form a first metal interconnection layer comprising a sacrificial metal patch having a width greater than said width of said fuse element;
h. forming a second dielectric layer over said sacrificial metal patch and said first metal interconnection layer;

i. forming a passivation layer over said second dielectric layer;
j. patterning said passivation layer and said second dielectric layer to form a fuse window using a first fuse window etch selective to said sacrificial metal patch, and using said sacrificial metal patch as an etch stop; said fuse window having a width greater than the width of said sacrificial metal patch; and
k. etching said sacrificial metal patch through said fuse window using a second fuse window etch selective to said first dielectric layer.

15. The method of claim 14 wherein said first fuse window etch is performed using a dry etch process with a $CF_4$, $CF_3$, and Ar chemistry and said second fuse window etch is performed using a dry etch process with a $BCl_3$, $Cl_2$, and $SF_6$ chemistry.

16. The method of claim 15 wherein, following said etching of said sacrificial metal patch through said fuse window, said first dielectric layer has a thickness of between about 400 Angstroms and 6000 Angstroms over said fuse element.

* * * * *